United States Patent
Dorfer

(10) Patent No.: US 6,310,449 B1
(45) Date of Patent: Oct. 30, 2001

(54) DEVICE HAVING A VARIABLE-SPEED MOTOR

(75) Inventor: Roland Dorfer, Keutschach (AT)

(73) Assignee: U.S. Philips Corporation, New York, NY (US)

( * ) Notice: Subject to any disclaimer, the term of this patent is extended or adjusted under 35 U.S.C. 154(b) by 0 days.

(21) Appl. No.: 09/514,173

(22) Filed: Feb. 28, 2000

(30) Foreign Application Priority Data

Mar. 1, 1999 (EP) .................................................. 99890069

(51) Int. Cl.$^7$ ............................... H02P 1/00; H02P 3/00; H02P 5/00
(52) U.S. Cl. ............................................. 318/139; 318/599
(58) Field of Search ..................................... 318/139, 599, 318/244, 245, 430, 431; 388/804, 811, 819

(56) References Cited

U.S. PATENT DOCUMENTS

| | | | |
|---|---|---|---|
| 4,458,183 | * 7/1984 | Neilson | 318/139 |
| 5,268,987 | * 12/1993 | Sakoh | 388/819 |
| 5,602,448 | * 2/1997 | Yaguchi | 318/139 |
| 5,703,447 | * 12/1997 | Higuchi | 318/139 |
| 5,811,948 | * 9/1998 | Sato et al. | 318/434 |
| 6,060,859 | * 5/2000 | Jonokuchi | 318/801 |

FOREIGN PATENT DOCUMENTS

| | | | |
|---|---|---|---|
| 19754574 | 6/1999 | (DE) . | |
| 0222042A1 | 5/1987 | (EP) | ............... H03K/17/06 |
| 0637874A1 | 2/1995 | (EP) . | |
| 57097385-A | * 6/1982 | (JP) | ..................... 388/811 |

* cited by examiner

Primary Examiner—Robert E. Nappi
Assistant Examiner—Edgardo San Martin
(74) Attorney, Agent, or Firm—Ernestine C. Bartlett; Bernard Franzblau

(57) ABSTRACT

In a device (1) having a variable-speed motor (2), a single switching device (9) has been provided for influencing the speed of the motor and for generating turn-off voltage transients (SP) on a coil terminal (3b) of the motor. The turn-off voltage transients can be applied to a voltage boosting circuit (14) for generating a d.c. control voltage required for driving a control electrode of the single switching device. This d.c. control voltage is supplied to the control electrode of the switching device with the aid of a control pulse generator (10). The d.c. control voltage reaches a higher value than the d.c. supply voltage (V) applied to the device (1). Preferably, the device includes a starting circuit (20), by which a minimum d.c. control voltage, required for the control electrode of the single switching device, can be generated for the first time in order to drive the single switching device into its conductive state.

19 Claims, 2 Drawing Sheets

DEVICE HAVING A VARIABLE-SPEED MOTOR

BACKGROUND OF THE INVENTION

This invention relates to a device including a motor whose speed is controlled by the energization and deenergization thereof in a pulsating manner.

Such a device of the type defined in the opening sentence is commercially available and frequently used in practice, and it is consequently known. For such a device reference can be made, for example, to the patent document EP 0 222 042 A1, FIG. 3.

The known device includes two separate switching means, of which a first switching means serves for connecting and disconnecting the coil arrangement of the motor in a pulsating fashion for the purpose of controlling the speed of the motor, and of which a second switching means serves to produce turn-off voltage transients across the coil arrangement. The known device further includes a control pulse generator for each of the two switching means. Two such switching means and two such control pulse generators are comparatively expensive and further have the problem that an undesired interaction may occur between the processes caused by the switching means, which may lead to invalidation of the results of these processes.

SUMMARY OF THE INVENTION

It is an object of the invention to improve a device of the type defined in the opening sentence and to provide an improved device having a simple construction, which precludes an invalidation of results by the switching means, as can occur in the prior art device.

The characteristic features provided in accordance with the invention result in a substantially simplified device in which an interaction between switching means is avoided and, consequently, no interactions between the processes caused by the switching means can occur, as a result of which the results of such processes cannot be invalidated.

The single switching means may be constituted, for example, by a bipolar transistor, but when such a bipolar transistor is used care must be taken that the available d.c. supply voltage is at least a factor of ten (10), but preferably an even greater factor, higher than the saturation voltage of the bipolar transistor used, because otherwise a comparatively large portion of the energy provided by the d.c. supply voltage is transformed into heat. It has proved to be particularly advantageous if a device in accordance with the invention uses a field effect transistor as the single switching means because the construction of the single switching means as a field-effect transistor (FET) makes it possible to achieve an energy saving and simple voltage supply to its control electrode. Moreover, by an appropriate dimensioning of the voltage boosting means the FET can be given a low turn-on resistance when the motor is connected to the d.c. supply voltage, which is of particular importance for the connection of a variable-speed motor to a d.c. supply voltage.

A device in accordance with the invention can be operated with a d.c. supply voltage which is only slightly higher than the direct voltage required for controlling the control electrode of the single switching means. A variant of the device having the characteristic features defined in claim 3 has proved to be particularly advantageous because a reliable starting of the motor is then even guaranteed if the value of the d.c. supply voltage available during operation is smaller than the minimum value of the control voltage required for the control electrode of the single switching means.

The starting means may take the form of, for example, a wiper contact or a bipolar transistor. However, it has proved to be advantageous when the starting means is a clamping circuit coupled to the control electrode of the single switching means. This measure guarantees a particularly reliable starting of the motor, starting being highly independent of aging as compared with a wiper contact.

For a highly reliable starting of the motor of the device in accordance with the invention the provision of a timing means coupled to the starting means has proved to be very advantageous. The coupling of a timing means to the starting means, constructed as a clamping circuit, enables a well controlled and efficient use of the clamping circuit.

The abovementioned as well as further aspects of the invention will become apparent from the two examples of embodiments described hereinafter and will be elucidated with reference to these examples.

BRIEF DESCRIPTION OF THE DRAWINGS

The invention will now be described in more detail with reference to the drawings, which shows two embodiments given by way of example but to which the invention is not limited.

DESCRIPTION OF THE PREFERRED EMBODIMENTS

Figure 1:
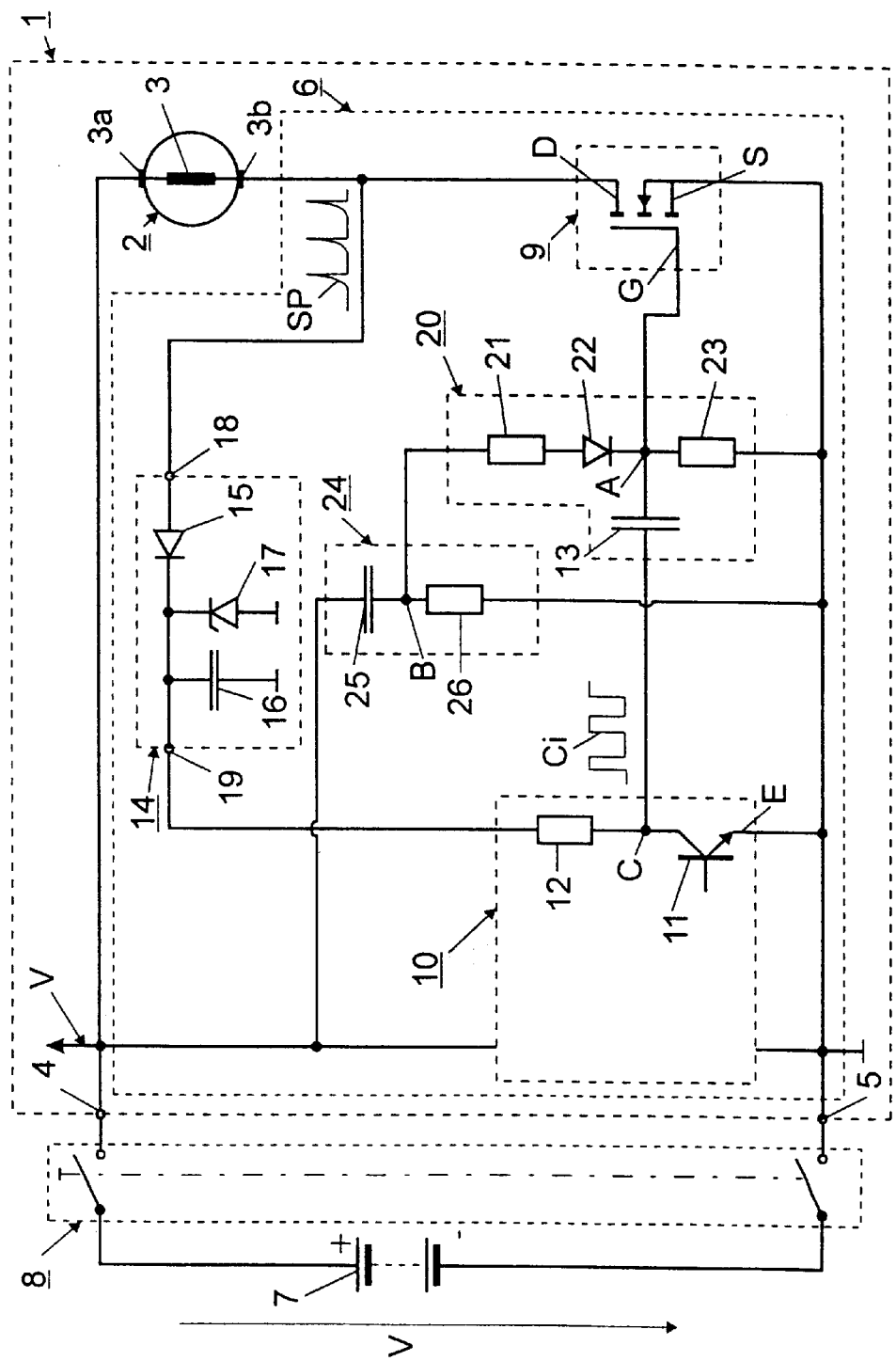
FIG. 1 shows diagrammatically and partly in the form of a block diagram a device in a first embodiment of the invention.

FIG. 1 shows a device 1 having a motor 2. The motor 2 includes a coil arrangement 3 having two coil terminals 3a and 3b. The device 1 has two terminal means 4 and 5 arranged to receive a d.c. supply voltage V in operation, which voltage has a nominal value of 1.2 V in the present case. The first terminal means 4 of the device 1 has an electrically conductive connection to the first coil terminal 3a of the coil arrangement 3, as a result of which the d.c. supply voltage V is available across the coil arrangement 3.

The device 1 further includes a circuit 6 adapted to power the motor 2. It is to be noted that the source for the d.c. supply voltage V of the device 1 shown in FIG. 1 takes the form of an external NiCd battery, which can be disconnected from and connected to the terminal means 4 and 5 of the device 1 by means of a switch 8. It is to be noted that instead of an NiCd battery 7 any other direct voltage source may be used in order to provide a d.c. supply voltage V. Furthermore, it is to be noted that the d.c. supply voltage V may alternatively be applied to the terminal means 4 and 5 of the device 1 from a direct voltage source accommodated inside the device 1.

The circuit 6 of the device 1 includes a switching means 9, which is advantageous formed by a field-effect transistor (FET) 9 and which has a first electrode D arranged in series with the second coil terminal 3b of the coil arrangement 3 and which, in its conductive state, enables an electrically conductive connection to be established between the second terminal means 5 and the second coil terminal 3b via a second electrode S. The switching means 9 has a control electrode G which serves for controlling the switching means 9. The switching means 9 serves both for connecting and disconnecting the coil arrangement 3 of the motor 2 to the d.c. supply voltage V in a pulsating fashion for the purpose of influencing the speed of the motor 2 and for producing turn-off voltage transients SP on the second coil terminal 3b of the coil arrangement 3 of the motor 2.

The device 1 includes a control pulse generator 10 which is shown diagrammatically and of which only a transistor 11 at the output side and a collector resistance 12 connected to the collector electrode C of this transistor are shown. The control pulse generator 10 receives the d.c. supply voltage V when the switch 8 is closed. The emitter electrode E of the transistor 11 is connected to the second terminal means 5 of the device 1. The control pulse generator 10 is adapted to generate and supply a control pulse sequence Ci to the collector electrode C of the transistor 11. This control pulse sequence Ci can be applied to the control electrode G of the switching means 9 via a capacitor 13 and a circuit node A. It is to be noted that a control pulse generator 10 which is typical of the device 1 as shown in FIG. 1 takes the form of a constant-frequency astable multivibrator having means for duty cycle modulation. However, such a control pulse generator may alternatively include a variable-frequency astable multivibrator.

The output transistor 11 of the control pulse generator 10 is powered via a voltage boosting means 14 which precedes the collector resistor 12. The voltage boosting means 14 in the device 1 is formed by a series arrangement of a diode 15 and a parallel arrangement of a capacitor 16 and a zener diode 17. The voltage boosting means 14 has an input 18 connected to the anode of the diode 15, whose cathode is connected directly to an output 19 of the voltage boosting means 14. The input 18 of the voltage boosting means 14 is connected to the second coil terminal 3b and the first electrode D of the switching means 9.

The device 1 further includes a starting means 20 comprising the capacitor 13 and a series arrangement of a resistor 21, a diode 22 and a further resistor 23, the capacitor 13 being connected to the node between the diode 22 and the resistor 23 and the further resistor 23 being connected to the second terminal means 5 of the device 1.

The device 1, i.e. its circuit 6, further includes a timing means 24 for reducing the action time of the starting means 20. The means 24 comprises a capacitor 25 connected to the first terminal 4 and, arranged in series with this capacitor, a resistor 26 connected to the second terminal 5. A node B between the capacitor 25 and the resistor 26 as is connected to the resistor 21 of the starting means 20 and is thus coupled to the starting means 20.

The operation of the circuit 6, and consequently of the device 1, will be described in more detail hereinafter.

Upon closure of the switch 8 the d.c. supply voltage V supplied by the NiCd battery 7 is applied to the device 1 via the two terminal means 4 and 5. The voltage appearing across the resistor 26 corresponds exactly to the d.c. supply voltage V at the closing instant of the switch 8 and decreases as an exponential function of time, which is defined by a time constant determined by the value of the resistor 26 and the value of the capacitor 25. The means 24 for reducing the action time of the starting means 20 and formed by the combination of the resistor 26 and the capacitor 25 is connected to the starting means 20 via the node B, as a result of which the voltage which appears on the node B and which decreases exponentially as a function of time is applied to the starting means 20 as a d.c. supply voltage which varies as a function of time, the action time of the starting means 20 being consequently dictated by the time characteristic of this voltage.

At the instant at which the switch 8 is closed for the first time and the d.c. supply voltage V is supplied from the NiCd battery 7 to the device 1 via the two terminal means 4 and 5 and at which the transistor 11 of the control pulse generator 10 is turned on by virtue of the operation of the control pulse generator 10, the coil arrangement 3 of the motor 2 is also connected for the first time to the d.c. supply voltage V from the NiCd battery 7 via a current path which extends from the first terminal means 4 to the second terminal means 5 via the coil arrangement 3, the voltage boosting means 14, the resistor 12 and the transistor 11. In this state of the circuit the capacitor 13 is charged to a voltage value via the resistor 21 and the diode 22. A time constant determined by the combination of the capacitor 13 and the resistor 21 is small in comparison with the time constant determined by the combination of the capacitor 25 and the resistor 26 of the means 24. Furthermore, it is to be noted that the value of the resistor 23 of the starting means 20 is high in comparison with the value of the resistor 21 of the starting means 20. It has proved to be particularly advantageous to make the value of the resistor 21 so low that the control pulse generator 10 still starts in a reliable manner. Moreover, it is pointed out that in the case of an initial turn-on period of the transistor 11 shorter than the time constant defined by the capacitor 13 and the resistor 21 a voltage appears on the node which is smaller than the d.c. supply voltage V minus the voltage drop across the diode 22. Another effect which reduces the voltage across the capacitor 13 is obtained as a result of the variation in time of the voltage on the node B.

When the transistor 11 is turned on for the first time under control of the control pulse generator 10 the coil arrangement 3 of the motor 2 is disconnected from the d.c. supply voltage V. On the output 19 of the voltage boosting means 14 a voltage is built up which corresponds to the d.c. supply voltage V minus the forward voltage of the diode 15. The interruption of the current flow through the transistor 11 of the control pulse generator 10 causes a voltage swing on the collector electrode C of the transistor 11, which voltage swing corresponds to the voltage on the output 19 of the voltage boosting means 14. As a result of this, the voltage which appears on the node A of the starting means 20 is also raised by the voltage drop across the capacitor 13. Owing to the provision of the diode 22 and the high value of the resistor 23 in comparison with the value of he resistor 21 the charge of the capacitor 13 remains substantially unchanged. Thus, after the transistor 11 has been turned off and turned on for the first time it is achieved with the aid of the starting means 20 that on the control electrode G of the switching means 9 a voltage is obtained which corresponds to substantially twice the d.c. supply voltage V minus the voltage drops across the diodes 15 and 22.

The cyclic turn-off and turn-on of the transistor 11 causes a continual rise of the voltage on the node A in dependence on the turn-on/turn-off frequency and in dependence on the two abovementioned time constants, which voltage is superimposed on the control pulse sequence Ci. Already after a few switching cycles of the transistor 11, or more precisely during each turn-on period of the transistor 11, the overall voltage on the node A assumes a value which is higher than the minimum value required for the d.c. control voltage for the control electrode G of the switching means 9, i.e. of the FET 9, to drive the switching means 9 into its conductive state. During each turn-off period of the transistor 11 the minimum voltage appearing on the gate electrode G of the FET 9 is clamped by the voltage appearing across the capacitor 13. Thus, the starting means 20 is formed by a clamping circuit. Furthermore, it is to be noted that the device 1 shown in FIG. 1 uses a FET 9 for which the minimum d.c. control voltage required on the gate electrode G of the FET 9 to drive this FET into its conductive state is smaller than the maximum control voltage which can be generated on node A. Moreover, it is to be noted that in the case of an extremely low d.c. supply voltage V, as supplied by the NiCd battery 7 in the device 1 shown in FIG. 1, Schottky diodes may be used for the diodes 15 and 22.

As soon as the voltage which appears on the node A, i.e. on the gate electrode G of the FET 9 reaches a value at which the FET 9 is driven into its conductive state, the coil arrangement 3 of the motor 2 is for the first time connected to the d.c. supply voltage V via the internal resistance which then exists between the first electrode D and the second electrode S of the FET. The continued cyclic turn-on and turn-off of the transistor 11 causes a cyclic connection and disconnection of the coil arrangement 3 of the motor 2 to and from the d.c. supply voltage V and gives rise to a series of turn-off voltage transients SP on the second coil terminal 3b of the coil arrangement 3 of the motor 2. The turn-off voltage transients SP are applied to the capacitor 16 of the voltage boosting means 14 via the diode 15 and charge the capacitor 16, the maximum voltage which can build up on the output 19 of the voltage boosting means 14 being defined by the zener voltage of the zener diode 17 provided in the voltage boosting means 14. During each turn-on period of the transistor 11 the voltage which appears instantaneously across the capacitor 13 is added to the voltage which builds up on the output 19 of the voltage boosting means 14. The internal resistance of the FET 9 decreases as the voltage on the gate electrode G of the FET 9 increases, which voltage has been applied, via the collector electrode of the transistor 11, as the sum of the voltage on the output 19 of the voltage boosting means 14 and the instantaneous voltage across the capacitor 13 and reaches a minimum value when a nominal value is reached on the output 19 of the voltage boosting means 14. At this instant the starting means 20 has already lost most of its effect owing to the fact that the voltage on the node B has already decreased distinctly. This ensures that the minimum voltage of the control pulse sequence Ci appearing on the gate electrode G of the FET 9 during the turn-off period of the transistor 11 lies below the minimum value of the d.c. control voltage required on the gate electrode G of the FET 9 in order to drive the FET 9 into its conductive state, as a result of which a reliable turn-off of the FET 9 is guaranteed.

During subsequent operation of the device 1 the speed of the motor 2 is influenced, namely in that the coil arrangement 3 of the motor 2 is connected and disconnected in a pulsating fashion with the aid of the single switching means 9, i.e. the FET 9. The speed of the motor 2 is variable in a range from approximately 1% to approximately 99% of the maximum possible speed of the motor 2 by means of the single control pulse sequence Ci, which can be supplied to the control electrode G of the single switching element 9 by the single control pulse generator 10. In the device 1 shown in FIG. 1 the single control pulse generator 10 is adapted to effect pulse width modulation, i.e. to influence the duty cycle of a constant-frequency control pulse sequence Ci. In the device 1 the duty cycle is influenced via a manual control which varies the resistance value of a potentiometer, not shown in FIG. 1, of the control pulse generator 10.

Since the control pulse generator 10 is adapted to supply the control pulse sequence Ci for the connection and disconnection of the coil arrangement 3 in a pulsating fashion, i.e. for influencing (controlling) the speed of the motor 2, and consequently the energization and de-energization of the coil arrangement 3 of the motor 2 for the purpose of generating turn-off transients SP used for powering the voltage boosting means are identical to the connection and disconnection of the coil arrangement 3, it is to be noted in this respect that the limits of the attainable speed variation of the motor 2 are dictated by the requirement of sustaining the output voltage on the output 19 of the voltage boosting means 14.

In the device 1 the measures in accordance with the invention have resulted in a highly simplified construction. Since only a single switching means 9, namely the FET 9, has been provided for the connection and disconnection of the coil arrangement 3 of the motor 2 to and from the d.c. supply voltage V and for the energization and deenergization of the coil arrangement 3 of the motor 2, interaction between switching means is avoided and, as a consequence, processes caused by switching means cannot influence one another. Moreover, the measures in accordance with the invention, particularly the provision of the voltage boosting means 14, enable the use of a comparatively favorable FET 9 in a standard version, which—if no voltage boosting means 14 had been provided—could only be used as a switching means 9 for influencing the speed of the motor 2 at a d.c. supply voltage V of at least 2.5 V, but which in the device 1 can be used correctly and without any problems in spite of the low d.c. supply voltage V of only 1.2 V for the device 1. The maximum voltage available on the output 19 of the voltage boosting means 14 is given by the nominal voltage of the zener diode 17, which is 6.8 V in the device shown in FIG. 1. In addition, the starting means 20 used in the device 1, which starting means has an action time limited by the timing means 24 and takes the form of a clamping circuit, enables a reliable and dependable starting of the motor 2 for the given voltage values mentioned above.

Figure 2:
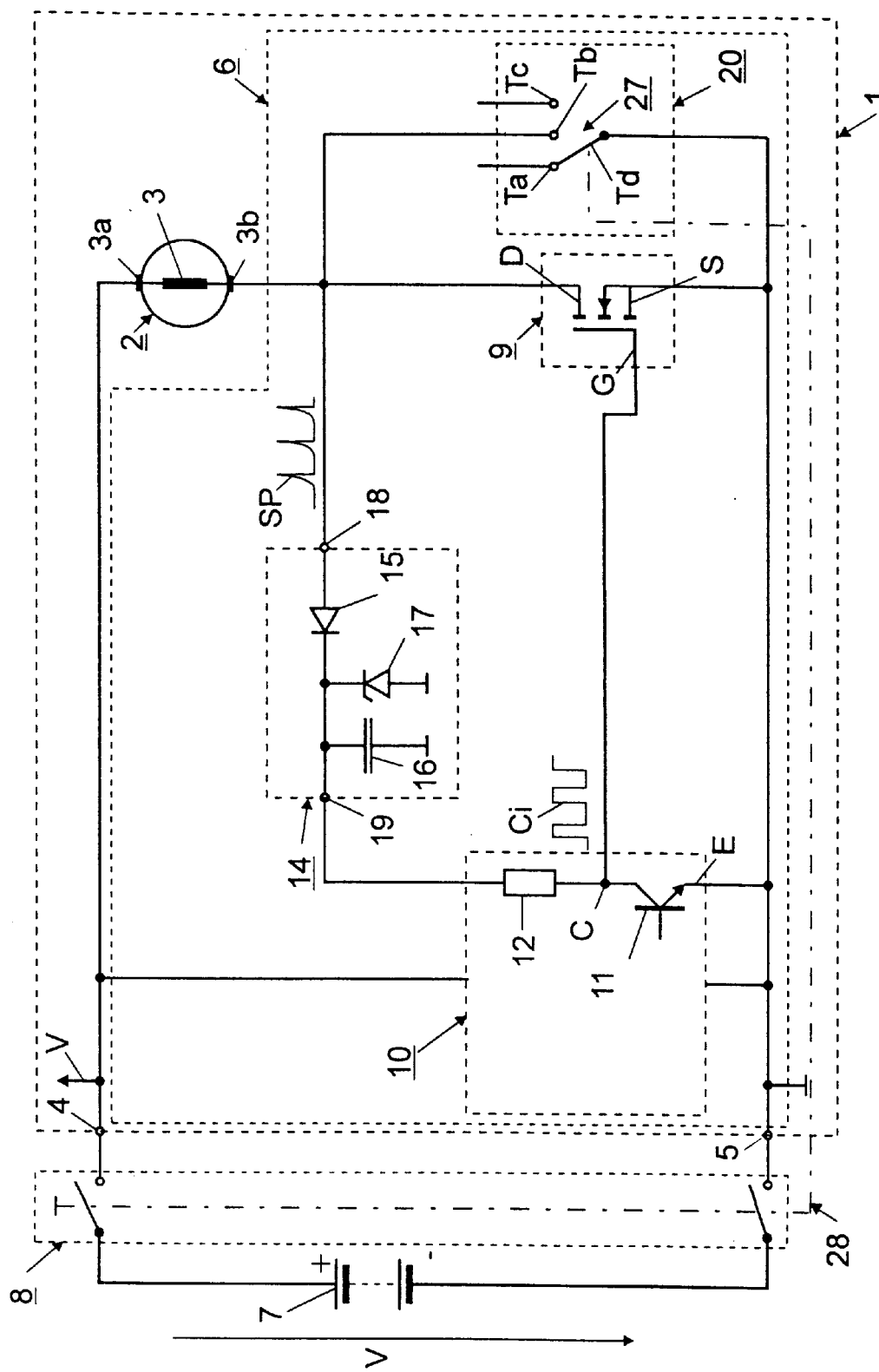
FIG. 2 shows, in the same way as FIG. 1, a device in a second embodiment of the invention.

FIG. 2 shows a second embodiment of a device 1 in accordance with the invention. This device 1 also includes a variable-speed motor 2 which has a coil arrangement 3 having two coil terminals 3a and 3b, a single control pulse generator 10, a voltage boosting means 14 and a starting means 20. However, in the present case the starting means 20 is realized by means of a switch 27 having a normally-closed contact Ta, a wiper contact Tb, a normally-open contact Tc and a fixed contact Td. The switch 27 of the starting means 20 is functionally coupled to the switch 8, as is shown by a dash-dot line 28 in FIG. 2.

In the device 1 shown in FIG. 2, the motor 2 is started by actuation of the switch 8. By means of the mechanical coupling 28 the wiper contact Tb of the switch 27 is briefly connected to the fixed contact Td, after which the normally-open contact Tc is connected to the fixed contact Td. Owing to the temporary connection of the wiper contact Tb with the fixed contact Td the coil arrangement 3 of the motor 2 is briefly connected to the d.c. supply voltage V, as a result of which a current flows through the coil arrangement 3, after which the current flow through the coil arrangement 3 is interrupted and, consequently, a turn-off voltage transient SP is produced on the coil terminal 3b, which transient is applied to the voltage boosting means 14 on whose output 19 it produces for the first time a voltage having a higher value than the minimum value required for the d.c. control voltage for the control electrode G of the single switching means 9 to drive the switching means 9 into its conductive state, which switching means also takes the form of a field-effect transistor (FET) in the device shown in FIG. 2. The voltage on the output 19 of the starting means 14 appears on the collector electrode C of the control pulse generator 10 via the resistor 12 and is applied to the control electrode G of the single switching means 9 in the form of a control pulse sequence Ci. As already stated for the device 1 shown in FIG. 1, the subsequently continued cyclic turn-on and turn-off of the transistor 11 causes a cyclic connection and disconnection of the coil arrangement 3 of the motor 2 to and from the d.c. supply voltage V and thus the energization and deenergization of the coil arrangement 3 with the aid of the single switching means 9. The turn-off voltage transients SP generated upon the deenergization subsequently serve to build up a nominal output voltage on the output 19 of the voltage boosting means 14. As a result of this, as already explained for the device 1 shown in FIG. 1, an optimum conduction is achieved between the two terminals D and S of the single switching means 9.

The implementation of the starting means 20 with the aid of the switch 27 results in a very robust and low-cost construction. The construction of the switch 27 as a printed circuit switch has proved to be very advantageous in view of the cost of the switch 27 and a good starting performance of the motor 2. In this variant the contact faces of the switch 27 are formed on a printed circuit board which also accommodates the circuit 6 and one switching contact of the switch 27 wipes over these contact faces on the printed circuit board. In this variant it is very advantageous when the wiper contact Tb takes the form of a series of separate contacts, as a result of which a series of turn-off voltage transients SP can be applied to the voltage boosting means 14 when the device 1 is put into operation by actuation of the switch 8 and, at the same time, the switch 27. Thus, a reliable starting of the motor 2 is achieved in a highly simple, robust, compact and cheap manner by the construction of the starting means 20 with the aid of the switch 27.

In an advantageous manner the device 1 shown in FIG. 2 also includes only one switching means 9 and one control pulse generator 10, which guarantees that also in this case the advantages of the device shown in FIG. 1 are obtained.

What is claimed is:

1. A motor control device which comprises a motor having a coil arrangement and whose speed can be controlled by energization and deenergization of the coil arrangement in a pulsating fashion, and which includes a circuit for powering the motor, and the circuit comprises; two terminal means arranged to receive a d.c. supply voltage in operation, one single switching means connected in series with the motor, which switching means serves for the connection and disconnection of the motor coil arrangement to and from the d.c. supply voltage in a pulsating fashion for the purpose of controlling the speed of the motor, a control pulse generator adapted to generate and supply a control pulse sequence to a control electrode of the switching means which serves for the connection and disconnection of the coil arrangement, wherein the one switching means also serves for the energization and deenergization of the coil arrangement and produces turn-off voltage transients on a coil terminal of the coil arrangement, wherein the control pulse sequence applied to the control electrode of the single switching means also serves for the energization and deenergization of the coil arrangement, voltage boosting means which receives the turn-off voltage transients and which is adapted to generate a d.c. control voltage in dependence on the turn-off voltage transients and which applies the generated d.c. control voltage to the switching means, which serves for the connection and disconnection of the coil arrangement, wherein the d.c. control voltage from the voltage boosting means and the control pulse sequence from the control pulse generator can be applied to said control electrode, and the connection and disconnection of the coil arrangement and the energization and deenergization of said coil arrangement are identical.

2. A motor control device as claimed in claim 1, wherein the single switching means comprises a field-effect transistor.

3. A motor control device as claimed in claim 1 which is adapted to operate at a d.c. supply voltage lower than the minimum voltage required for the d.c. control voltage for the control electrode of the single switching means to drive the single switching means into its conductive state, and further comprising a starting means which at start-up builds up a minimum d.c. control voltage required for the control electrode of the single switching means in order to drive the single switching means into its conductive state.

4. A motor control device as claimed in claim 3, wherein the starting means comprises a clamping circuit arranged before the control electrode of the single switching means.

5. A motor control device as claimed in claim 4, wherein the starting means is coupled to a timing means which limits the time interval during which the starting means is active.

6. A speed control apparatus for an electric motor having a coil arrangement, where the motor speed is controllable by the energization and deenergization of the coil arrangement, the motor speed control apparatus comprising:

first and second input terminals for connection to a d.c. supply voltage for the speed control apparatus, a controlled switching device having a control electrode, means for coupling the controlled switching device in series circuit with the electric motor to the first and second input terminals, a control pulse generator for supplying a sequence of control pulses to the control electrode of the controlled switching device to turn the controlled switching device on and off and thereby to both connect and disconnect the coil arrangement to the d.c. supply voltage and to energize and deenergize the coil arrangement, turn-off voltage transitions being produced at a coil terminal of the coil arrangement, voltage boosting means coupled to the coil terminal to receive the turn-off voltage transitions and which derives a d.c. control voltage dependent thereon, and second means for coupling said d.c. control voltage to the control electrode of the controlled switching device so that the d.c. control voltage and the sequence of control pulses together control the switching of the controlled switching device and thereby control the motor speed.

7. The motor speed control apparatus as claimed in claim 6 wherein the control pulse generator includes an output switching transistor coupled to the control electrode of the controlled switching device, and third means for coupling the output switching transistor to the voltage boosting means so as to supply the d.c. control voltage to the output switching transistor.

8. The motor speed control apparatus as claimed in claim 6 wherein the d.c. control voltage of the voltage boosting means is of a value that allows the apparatus to operate from a d.c. supply voltage below the minimum d.c. voltage required at the control electrode of the controlled switching device in order to drive the controlled switching device into its conductive state.

9. The motor speed control apparatus as claimed in claim 8 further comprising starting means coupled to at least one input terminal and to the control electrode of the controlled switching device and operative, at start-up of the apparatus, to derive a d.c. control voltage sufficient to drive the controlled switching device into its conductive state.

10. The motor speed control apparatus as claimed in claim 9 further comprising timing means coupled to the starting means so as to limit the operation time of the starting means at start-up of the apparatus.

11. The motor speed control apparatus as claimed in claim 6 further comprising starting means coupled to at least one input terminal and to the control electrode of the controlled switching device and operative, at start-up of the apparatus, to derive a d.c. control voltage sufficient to drive the controlled switching device into its conductive state.

12. The motor speed control apparatus as claimed in claim 11 wherein the starting means comprises a clamping circuit.

13. The motor speed control apparatus as claimed in claim 11 further comprising timing means coupled to the starting means so as to limit the operation time of the starting means at start-up of the apparatus.

14. The motor speed control apparatus as claimed in claim 7 wherein the control switching device comprises a field effect transistor and the voltage boosting means comprises a diode-capacitor circuit having an input coupled to said coil terminal and an output coupled to the control electrode of the controlled switching device and to one main electrode of the output switching transistor of the control pulse generator.

15. The motor speed control apparatus as claimed in claim 6 wherein the control pulse generator includes an output switching transistor coupled to an output of the voltage boosting means and also coupled to the control electrode of the control switching device via a capacitor, and
   a start-up circuit coupled between the first input terminal and the control electrode of the control switching device via a current path independent of said capacitor.

16. The motor speed control apparatus as claimed in claim 6 further comprising a start-up means comprising a mechanical switching device having a wiper contact comprising a plurality of separate contacts connected to said coil terminal of the motor coil arrangement thereby to generate a sequence of voltage transients at the coil terminal as a wiper arm of the mechanical switch sequentially contacts the separate contacts during a start-up operation of an electric motor coupled to the apparatus.

17. The motor speed control apparatus as claimed in claim 6 further comprising a timing circuit coupled to the control electrode of the controlled switching device and having a time constant that is longer than the time duration of several cycles of the control pulse sequence of the control pulse generator.

18. The motor speed control apparatus as claimed in claim 1 wherein the voltage boosting means derives a d.c. control voltage of a value to drive the single switching means into its conductive state.

19. The motor speed control apparatus as claimed in claim 6 wherein the voltage boosting means derives a d.c. control voltage of a value to drive the control switching device into its conductive state.

* * * * *